United States Patent [19]
Kramer

[11] Patent Number: 6,044,004
[45] Date of Patent: Mar. 28, 2000

[54] MEMORY INTEGRATED CIRCUIT FOR STORING DIGITAL AND ANALOG DATA AND METHOD

[75] Inventor: Alan Kramer, Berkeley, Calif.

[73] Assignee: STMicroelectronics, Inc., Carrollton, Tex.

[21] Appl. No.: 09/219,548

[22] Filed: Dec. 22, 1998

[51] Int. Cl.[7] .......................... G11C 27/00; G11C 16/06; G11C 7/00
[52] U.S. Cl. ...................... 365/45; 365/185.03; 365/222
[58] Field of Search ................................. 365/45, 185.03, 365/222

[56] References Cited

U.S. PATENT DOCUMENTS

| | | | |
|---|---|---|---|
| 4,209,852 | 6/1980 | Hyatt ....................................... | 365/222 |
| 4,280,196 | 7/1981 | Hornak et al. ............................ | 365/45 |
| 5,592,418 | 1/1997 | Sabatini et al. ..................... | 365/185.18 |
| 5,751,632 | 5/1998 | Choi et al. ........................... | 365/185.03 |
| 5,815,425 | 9/1998 | Wong et al. ........................ | 365/185.03 |
| 5,867,423 | 2/1999 | Kapoor et al. ..................... | 365/185.03 |

OTHER PUBLICATIONS

Kramer et al., "Flash–Based Programmable Nonlinear Capacitor for Switched–Capacitor Implementations of Neural Networks," *International Electron Devices Meeting 1994*, San Francisco, CA, pp. 449–452, Dec. 11–14, 1994.

Kramer et al., "ISSCC97/Session 2/TD: Vision Processors & CAMs/Paper TP 2.4," *1997 IEEE International Solid–State Circuits Conference*, pp. 44–45, 1997.

Rolandi et al., "ISSCC98/Session 21/Memory: NV and Embedded/Paper SA 21.2," *1998 IEEE International Solid–State Circuits Conference*, pp. 334–335, 1998.

*Primary Examiner*—Trong Phan
*Attorney, Agent, or Firm*—David V. Carlson; Theodore E. Galanthay; Lisa K. Jorgenson

[57] ABSTRACT

A memory device includes an array of floating gate FET memory cells capable of storing either analog or digital data. The memory device includes first read-write circuitry for storage and retrieval of digital data, and second read-write circuitry for storage and retrieval of analog data. As a result, the digital data storage capability facilitates real-time operation of devices using the memory device without sacrificing the memory capacity capabilities of analog data storage. When a host device using the memory device is not in use, the stored digital data may be read out from the memory device, converted to analog form and then stored in the memory device, re-capturing the data density capabilities of analog data storage in floating gate FET memory cells. Analog data latency comparable to digital data latency is achieved by reading the analog data out from the memory cells, refreshing the analog data and then re-storing digital or analog data corresponding to the refreshed analog data in the memory cells in response to predetermined criteria.

40 Claims, 5 Drawing Sheets

MEMORY INTEGRATED CIRCUIT FOR STORING DIGITAL AND ANALOG DATA AND METHOD

TECHNICAL FIELD

The present invention relates in general to memory devices and in particular to memory devices for storage and retrieval of analog and digital data.

BACKGROUND OF THE INVENTION

Figure 1:
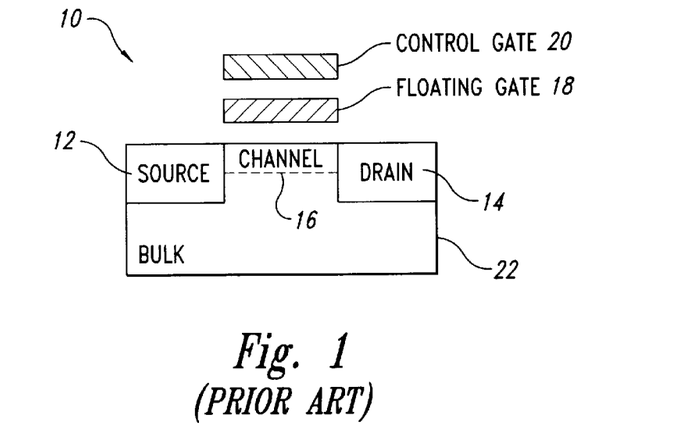
FIG. 1 is a simplified side view of a floating gate FET memory cell 10.
Figure 2:
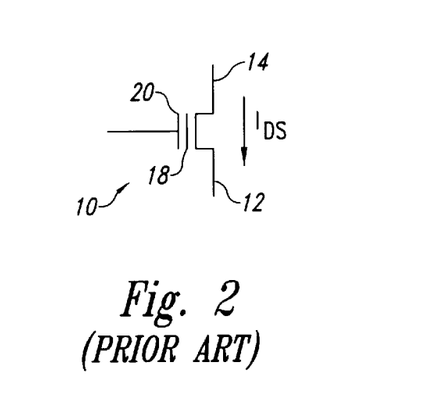
FIG. 2 is a simplified schematic diagram of the floating gate FET memory cell 10 of FIG. 1, in accordance with the prior art.

FIG. 1 is a simplified side view of a floating gate FET memory cell 10, and FIG. 2 is a simplified schematic diagram of the floating gate FET memory cell 10 of FIG. 1, in accordance with the prior art. The floating gate FET memory cell 10 includes a source 12, a drain 14, a channel 16 extending from tile source 12 to the drain 14, a floating gate 18 and an externally-accessible control gate 20, all conventionally formed on a semiconductor substrate 22. The floating gate FET memory cell 10 is programmed to store a predetermined amount of charge on the floating gate 18 by application of suitable voltages to the control gate 20, the source 12 and the drain 14.

Application of a positive voltage to the control gate 20 and/or the drain 14 can cause electrons to tunnel through a dielectric layer separating the floating gate 18 from the channel 16. These electrons then charge the floating gate 18, altering a threshold voltage of the floating gate FET memory cell 10. The amount of charge that is stored on the floating gate 18 can later be measured by determining the threshold voltage of the floating gate FET memory cell 10. The more electrons that are stored on the floating gate 18, the more positive the threshold voltage will be.

Application of a suitable voltage to the control gate 20 can cause electrons stored on the floating gate 18 to tunnel out from the floating gate 18, thus erasing the data that were stored in the floating gate FET memory cell 10. Typically, a verify operation is employed at the beginning and the end of each programming operation to determine the status of the floating gate FET memory cell 10.

When the verify operation determines that the status of the floating gate FET memory cell 10 is not what it should be, the programming or erasing operations and the verify operation may be repeated until the verify operation verifies that the floating gate FET memory cell 10 has reached the desired status. When a predetermined number of these operations fail to provide the desired status, the floating gate FET memory cell 10 is deemed defective and is not used again.

Floating gate FET memory cells 10 can be programmed in several different ways. In a first mode of operation, digital data, i.e., logic "0" or logic "1", are stored in each of the floating gate FET memory cells 10. Because the exact value of the threshold voltage shift is not of great concern, digital values can be rapidly programmed by application of a relatively large voltage pulse to the floating gate FET memory cell 10 to ensure at least a certain minimum threshold voltage.

In a second mode of operation, analog data are stored in each of the floating gate FET memory cells 10. In this mode, the amount of threshold voltage shift is of great concern, because this amount is what represents the stored data. Additionally, the tunneling process tends to be somewhat stochastic, because tunneling is a random process, manufacturing variations are random and because the programming behavior of any one floating gate FET memory cell 10 is, to some extent, a function of the prior history of that floating gate FET memory cell 10. As a result, analog data storage is carried out by application of one or more programming pulses to the floating gate FET memory cell 10, followed by reading the threshold voltage of the floating gate FET memory cell 10, comparison of the read value to the desired value and application of further programming pulses as needed.

The programming pulses used in analog programming of floating gate FET memory cells 10 may be longer than those used for digital programming and may have different amplitudes. Because programming each analog value requires both applying multiple pulses and conducting multiple readings of the value stored in the floating gate FET memory cell 10 that is being programmed, programming of analog values takes much longer than programming of digital values. Pulses after the first or subsequent verify read operation during an analog programming sequence may be advantageously modified using results read after the preceding programming pulse or pulses to determine subsequent pulse parameters.

Figure 3:
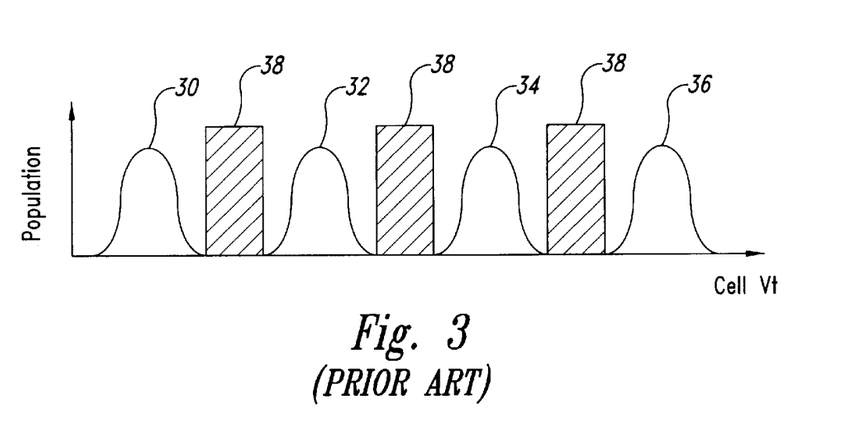
FIG. 3 is a graph simulating stored multi-level analog value variations in a population of the floating gate FET memory cells of FIGS. 1 and 2, in accordance with the prior art.

FIG. 3 is a graph simulating stored multi-level analog value variations in a population of the floating gate FET memory cells 10 of FIGS. 1 and 2, in accordance with the prior alt. In FIG. 3, distributions of threshold voltages 30, 32, 34, 36 correspond to specific individual analog values each stored in an individual floating gate FET memory cell 10. Hatched regions separating the voltage ranges 30, 32, 34, 36 correspond to forbidden voltage ranges 38. The forbidden voltage ranges 38 are threshold voltage values that are not programmed into the floating gate FET memory cells 10. These ranges 38 facilitate determination of the analog value represented by a threshold voltage measured during a read operation on a given floating gate FET memory cell 10.

Storage of analog or digital data using floating gate FET memory cells 10 allows a memory device to be programmed with new data. Analog data storage provides data density advantages relative to digital data storage, because storage of discrete levels of charge on a floating gate FET memory cell 10 allows information content equivalent to a number of bits to be stored in the same physical area that a single digital bit can be stored in.

However, the density advantages provided by storage of analog data are offset by several other considerations. More programming time is required to store analog data, because multiple programming pulses are required, the programming pulses may be longer and because the read and verification operations are also longer. Conventional incremental-step pulse programming, while providing greater control over the amount of charge stored on the floating gate 18 and thus providing tighter control over programmed threshold voltage shifts, also may require more time in order to verify the programmed threshold voltage shift. Additionally, longer read times are typically required, because the settling times involved in reading analog values are longer than those for digital values.

A further consideration is that the time required for a given amount of charge to leak into or out of the floating gate 18 is the same for both types of memories, but the degree to which stored data are corrupted by a given amount of charge leakage is markedly greater for analog data than for digital data. As a result, the period for which stored data can be expected to be valid is substantially greater for digital data stored in floating gate FET memory cells 10 than for analog data stored in floating gate FET memory cells 10 having comparable dimensions and other characteristics.

SUMMARY OF THE INVENTION

In one aspect, the present invention allows both digital and analog data to be stored in the same floating gate FET memory cell array.

In another aspect, the present invention allows rapid storage of digital data in order to facilitate real time operation of a host device incorporating a memory that includes the floating gate FET memory cell allay, such as a digital camera. When the host device is inactive, shut down or turned off, the stored digital data may be read out of the memory, converted to analog data and then re-written to the memory. As a result, the total amount of data that may be stored in the memory can be increased, compared to what would be possible if the memory were only capable of storing digital data.

In another aspect, the present invention extends the latency of the memory, or the period over which data can be stored in the memory. In response to predetermined criteria, stored analog or digital data are read out from the memory and are restored to levels corresponding to the values that were initially stored in the memory. The restored data are then re-written to the memory. In one aspect, this can allow data originally stored in digital form in the memory to be stored more compactly in analog form but with storage latencies at least comparable to those possible for digital data.

In another aspect, the present invention allows a memory formed from floating gate FET memory cells to be dynamically reconfigured. In response to either preprogrammed criteria or signals from a user or from a host device incorporating the memory, characteristics of sectors of the memory can be altered to provide higher data density storage, improved latency or other characteristics. Data describing the characteristics of the various sectors may be stored in a reference portion of the memory, and may be updated when the configuration of the memory is altered. As a result, one memory product can provide a wide variety of memory characteristics. Additionally, the characteristics of the memory can be dynamically altered, before or after the memory has been incorporated into a host device.

DETAILED DESCRIPTION OF THE INVENTION

Figure 4:
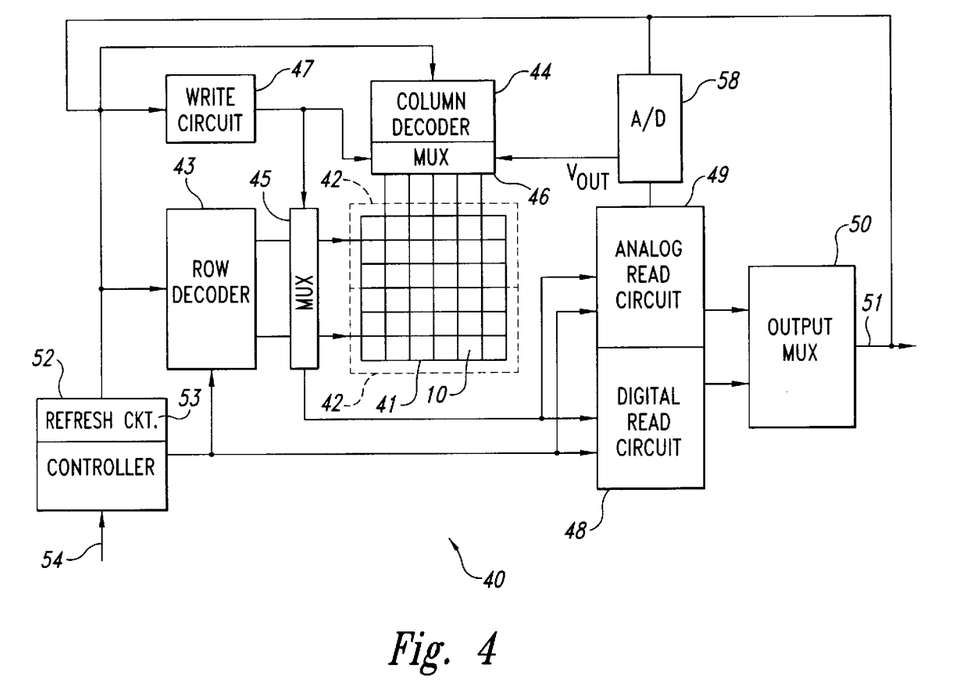
FIG. 4 is a simplified block diagram of a floating gate FET memory device, in accordance with an embodiment of the present invention.

FIG. 4 is a simplified block diagram of a floating gate FET memory device 40, in accordance with an embodiment of the present invention. The memory device 40 includes an allay 41 of the floating gate FET memory cells 10 of FIGS. I and 2, divided into sectors 42. Each sector 42 includes one or more groups of floating gate FET memory cells 10 having sources coupled to a common row line of the memory array 41. Sectors 42 are erased by applying a source bias to all of the floating gate FET memory cells 10 that are to be erased. It is often advantageous to design the memory array 41 to include row lines having as many floating gate FET memory cells 10 as possible. Sizes for virtual sectors 42 formed from groups of row lines may be dynamically allocated by a user by programming instructions for the controller 52 into a dedicated portion of the memory array 41, either prior to or during assembly into a host device (not illustrated) incorporating the memory device 40 or after completion of the host device, e.g., while the host device is in use.

Individual floating gate FET memory cells 10 in the array 41 are addressed by decoding row and column addresses in the row decoder 43 and the column decoder 44. A row multiplexer MUX 45 accesses the source 12 and the drain 14 of the floating gate FET memory cell 10 addressed by the row decoder 43 and a column MUX 46 accesses the control gate 20 of that cell 10 in response o signals from the column decoder 44. It will be appreciated that in practice, separate read and write MUXs may be used for the source and drain in the row multiplexing operations, but these are represented here as one row 45 MUX for simplicity of illustration and ease of understanding. In some embodiments, there may additionally be separate MUXs needed for the read and write cycles. During a write operation, a write circuit 47 applies pulses to the control gate 20 through the column MUX 46, using either a digital or an analog write algorithm.

Digital read circuits 48 are coupled through the row and column MUXs 45 and 46 to read digital data from the floating gate FET memory cells 10. In reading a floating gate FET memory cell 10, the row and column MUXs 45 and 46 couple the control gate 20 and either the source 12 or the drain 14 to suitable voltages, and couple the other of the source 12 or drain 14 to the digital read circuits 48. In one embodiment, the row MUX 45 couples the source 12 to ground and the drain 14 to the digital read circuit 48 while the column MUX 46 applies a positive voltage to the control gate. In general, the MUXs 45 and 46 perform two functions: (i) to couple signals to a particular floating gate FET memory cell 10 and (ii) to couple the connect signal to the floating gate FET memory cell 10 to perform an analog read, a digital read, an analog write, or a digital write function.

In one embodiment, the digital read circuits 48 are formed using conventional digital sense amplifiers. Analog read circuits 49 are coupled through the row and column MUXs 45 and 46 to read analog data from other floating gate FET memory cells 10, as described in "1 M-cell 6b/cell Analog Flash Memory for Digital Storage", ISSCC98, pp. 334–5, by P. L. Rolandi et al. The read circuits 48 and 49 provide read data from the array 41 as digital signals to an output MUX 50 that, in turn, can provide output data to the host device through an output 51.

The write circuit 47, the digital read circuits 48, the analog read circuits 49 and the row 43 and column 44 decoders are controlled by a controller 52 that determines when to store incoming digital data in analog form and when to store the digital data in digital form to facilitate real-time operation of a host device, such as a digital camera, that incorporates the memory device 40. Examples of conventional read circuits 48 for reading stored data from floating gate FET memory cells 10 are discussed in U.S. Pat. Nos. 5,673,221; 5,592,418; 5,012,438; 4,964,079 and 4,809,224, along with other peripheral circuits and design considerations. In some embodiments, charge domain or conductance mode operation may provide significant power consumption advantages.

In one embodiment, the write circuit 47 is one circuit that uses different pulse programming in the digital and analog write modes. In writing digital data, a single pulse may be sufficient to ensure that at least a desired amount of charge is injected into the floating gate 18. In writing analog data, multiple pulses are typically employed, and read cycles are interleaved between the pulses. The analog read circuit 49 converts the read analog value to a digital value that is compared to the value to be stored and supplies additional voltage pulses to modify the stored value until the desired value is stored.

Write circuits 47 tend to be large because a low series resistance is required from the transistor delivering the write pulse and secondarily because high voltage transistors are required. These transistors require more integrated circuit area than standard transistors. As a result, use of a single write circuit 47 having controllers and control sequences adapted to writing either analog or digital data results in more efficient usage of integrated circuit area. In another embodiment, multiple write circuits 47 may be employed to realize the analog and digital write functions.

Circuits to provide a programming pulse are currently used and well known in the alt for both digital and analog flash memory cells, so the details need not be shown. The write circuit 47 provides the programming pulse in an acceptable manner known in the art.

In some embodiments, the controller 52 stores incoming data in digital form. In response to predetermined criteria, the controller 52 causes the digital read circuitry 48 to read data from the floating gate FET memory cells 10 and then directs the read data to the write circuit 47 through the output 51 of the MUX 50 to write corresponding analog values to another portion of the memory array 41. For example, eight bits of digital data can be read from eight separate floating gate FET memory cells 10 and then converted to one of 256 different analog values. The corresponding analog value is then written by the write circuitry 47 to one of the floating gate FET memory cells 10. As a result, eight times as much information can be stored in the memory array 41 in analog form as was possible by storing data in digital form. Other data compression ratios are also possible.

In one embodiment, some sectors 42 of the floating gate FET memory cells 10 are dedicated to storage of either digital or analog data. In another embodiment, the write circuit 47, the digital read circuitry 48 and the analog read circuit 49 are able to access overlapping sectors 42 of the array 41, or the entire array 41.

Row 43 and column 44 address decoder circuits operate under the control of the controller 52 to access specific floating gate FET memory cells 10 or sectors 42 of floating gate FET memory cells 10, either to store incoming data, to output data from the memory device 40 or to read data from and then write data to the array 41. An input 54 to the controller 52 allows the controller 52 to interact with circuitry external to the memory device 40, and also accepts input data for storage, in addition to coupling commands from the host device to the memory device 40. For example, the input 54 may permit the controller 52 to determine that the host device into which the memory device 40 is built is not in use or has been turned off, i.e., may function as a sleep mode detector for determining that the host device is inactive, or that it will not be likely to access the memory device 40.

The controller 52 is coupled to a refresh circuit 53, which may be formed as a component of the controller 52. The refresh circuit 53 is configured to determine when to command the analog read circuit 49 to read analog values from the memory array 41 and when to have the write circuit 47 write refreshed analog values corresponding to the read analog values to a portion of the memory array 41 that is different from a portion of the memory array 41 from which the read values were obtained.

Figure 5:
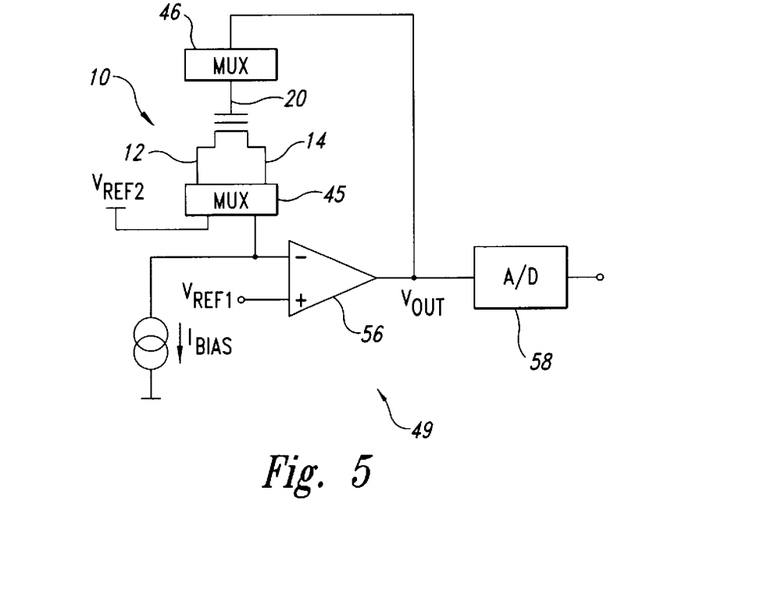
FIG. 5 is a simplified schematic diagram of an analog sense amplifier circuit, in accordance with an embodiment of the present invention.

FIG. 5 is a simplified schematic diagram of an embodiment of the analog sense amplifier circuit 49 of FIG. 4, in accordance with an embodiment of the present invention. The analog sense amplifier circuit 49 includes an operational amplifier 56 having a first input coupled to a first reference voltage $V_{REF1}$ and a second input coupled to a constant current source $I_{BIAS}$. The second input is also to the drain 14 of the floating gate FET memory cell 10 that is to be read through the row MUX 45. The source of the floating gate FET memory cell 10 that is to be read is coupled through the row MUX 45 to a second voltage source $V_{REF2}$, and the control gate 20 of the floating gate FET memory cell is coupled through the column MUX 46 to an output VOUT of the amplifier 56. In the embodiment shown in FIG. 5, the first input is non-inverting and the second input is inverting, however, other arrangements are possible.

For example, the voltage $V_{REF1}$ may be —100 millivolts and the voltage $V_{REF2}$ may be ground. In operation, the current source $I_{BIAS}$ causes the second input to be more negative than the first input. As a result, the output voltage $V_{OUT}$ goes positive. When the output voltage $V_{OUT}$ reaches the threshold voltage that is programmed into the floating gate FET memory cell 10, the floating gate FET memory cell 10 begins to conduct. When the floating gate FET memory cell 10 begins to conduct, the voltage to the second input increases to a value close to $V_{REF1}$, thereby causing the amplifier 56 to stabilize with the output voltage $V_{OUT}$ very close to the programmed threshold voltage of the floating gate FET memory cell 10. In this example, a magnitude of the voltage $V_{REF2}$ is chosen to correspond closely to, but slightly exceed, a magnitude of a drain-source saturation voltage of tile floating gate FET memory cell 10. The voltage $V_{OUT}$ then is converted to a digital value by a conventional analog-to-digital converter 58.

Figure 6:
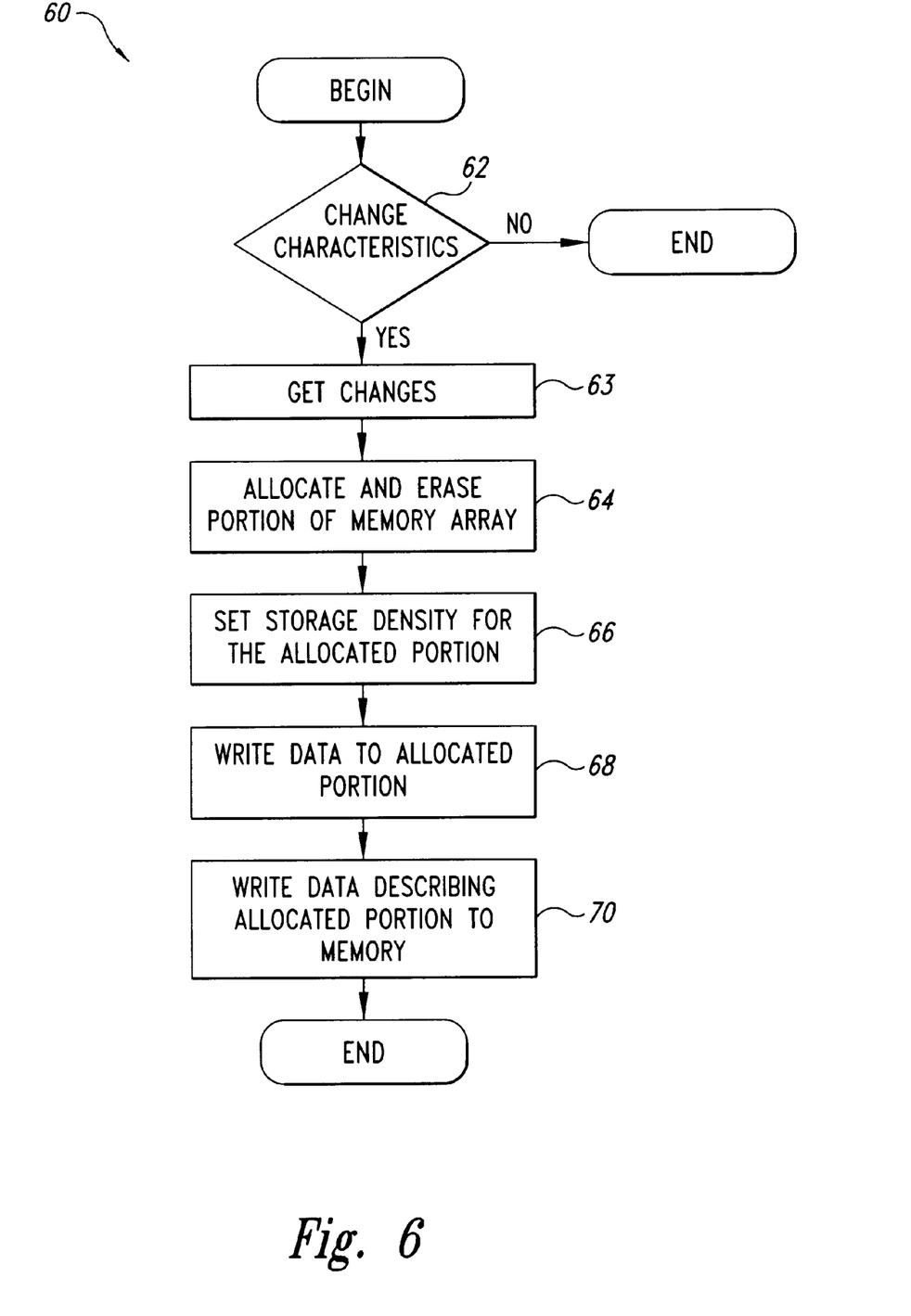
FIG. 6 is a simplified flow chart of a method for dynamic assignment of memory characteristics, in accordance with an embodiment of the present invention.

FIG. 6 is a simplified flow chart of a process 60 for dynamic assignment of characteristics of sectors 42 of the memory array 41 of FIG. 4, in accordance with an embodiment of the present invention. The process 60 begins when a query task 62 determines how memory characteristics need to be modified or set, based on predetermined internal criteria or on input from a user of the host device or from the host device that includes the memory device 40. The query task 62 also determines how much of the memory array 41 needs to be allocated, what data storage density and other characteristics are required and any other characteristics and parameters that need to be determined. When the query task 62 determines that no changes are needed, the process 60 ends. When the query task 62 determines that changes are needed, the process 60 defines them and then implements them in steps 63, 64, 66, 68 and 70.

In the step 63, the needed allocation changes are determined, either through data from the host device or user via the input 54 of FIG. 4, or by the controller 52. In the step 64, a portion of the memory array 41 is allocated and erased. In the step 66, a data density or storage mode is determined for the allocated portion of the memory array 41. In the step 68, data is written to the allocated portion of the memory array 4 1. In the step 70, the memory device 40 stores information in a dedicated portion of tile memory array 41 describing the allocation and the data density so that the controller 52 is able to track memory allocation and data density. The data stored in the dedicated portion of the memory array 41 may also include a date or the equivalent, and/or other data, in order to keep track of other requirements, such as need to refresh stored data. The process 60 then ends.

For example, when the host device is a cellular telephone, system operating software needs to be stored in a reliable but re-programmable fashion and for a long period of time. A position of the memory array 41 of FIG. 4 may store these kinds of data in a low density format, e.g., as binary data or as low density analog data. A user. database, such as a list of frequently-called numbers or user-defined options, may not require as great a storage latency and thus may be stored in a higher density format. Voicemail data typically do not require high latency and may be stored (or re-stored, if initially stored more rapidly, but in a lower density mode) in a higher density format. Data such as "last number called" typically have very limited latency requirements and may be stored in a yet higher data density mode. Further, the user of the cellular telephone may determine how many such numbers are to be stored and may alter the sizes of various portions of the memory array 41 as well as the memory characteristics of those positions.

Figure 7:
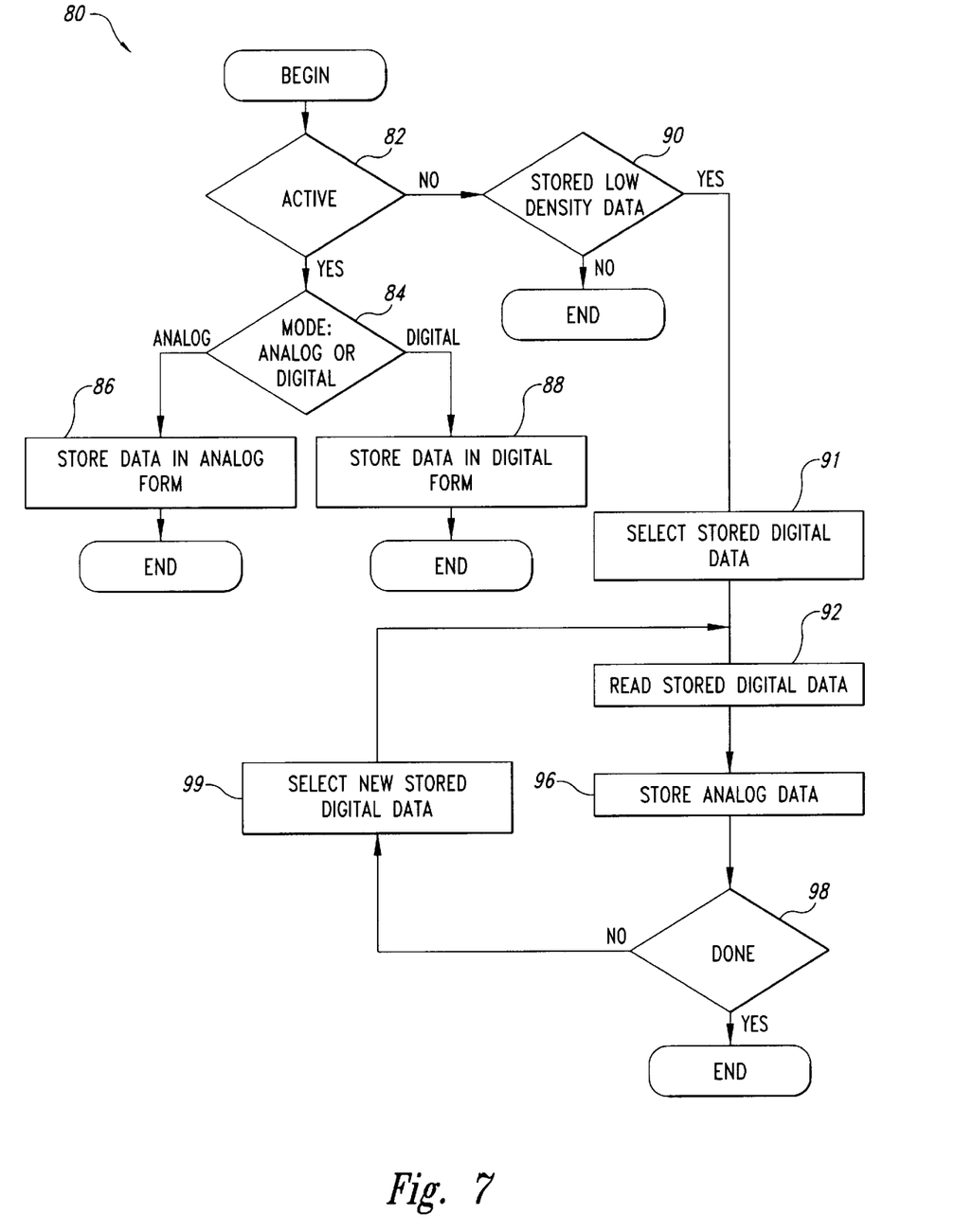
FIG. 7 is a simplified flowchart describing a method for storing data in a floating gate FET memory, in accordance with an embodiment of the present invention.

FIG. 7 is a simplified flowchart describing a process 80 for operating the memory device 40 of FIG. 4, in accordance with an embodiment of the present invention. The process 80 begins by determining, in a query task 82, if the memory device 40 is likely to be needed by the host device into which it is built. When the query task 82 determines that the host device is active and that data from the host device need to be stored in the memory device 40, a query task 84 determines an appropriate mode of operation for the memory device 40.

For example, when the host device into which the memory device 40 is built is a digital camera, it may be desirable to store incoming data in digital form in order to facilitate real-time operation of the host device. Conversely, even though digital data storage would otherwise be the preferred mode of operation, the controller 52 may determine that the amount of data storage capacity remaining in the memory device 40 is small enough that analog data storage is preferred. Similarly, the controller 52 may determine that one mode of data storage is preferable to another, or that a higher or lower density analog data storage mode is preferable, for a variety of other reasons.

When the query task 84 determines that analog operation or increased storage density is appropriate, the incoming data are stored in the array 41 in analog form in a step 86 and the process 80 then ends. When the query task determines that digital operation is appropriate, the incoming data are stored in the allay 41 in digital form in a step 88 and the process 80 then ends.

When the query task 82 determines that the host device is inactive or that the host device is unlikely to demand data storage with little notice, a query task 90 determines if there are stored digital data that can or should be converted to analog format for more compact data storage. When the query task 90 determines that no such digital data are stored in the allay 41, the process 80 ends. When the query task 90 determines that digital data that can be converted to analog format are being stored in the memory allay 41, a first block of the stored digital data are selected in a step 91. The first block of stored digital data are read out from the memory array 41 in a step 92.

An appropriate data density may be determined by the user, the host device or by the controller 52 of FIG. 4. The corresponding analog data are then stored in a new location of the allay 41 that is unused or that has been erased in a step 96 and has been reallocated to have the data storage density of the analog format. A query task 98 then determines if all of the stored digital data have been converted to analog format. When the query task 98 determines that all of the stored data that can be converted to analog format have been converted to analog format, the process 80 ends. When the query task 98 determines that not all of the stored digital data have been converted to analog format, a new block of stored digital data are selected in a step 99. Control then reverts to the step 92 to read the remaining stored digital data, and the steps 92, 96, 98 and 99 are reiterated until all of the stored data are stored in analog format.

Typically, the floating gate FET memory cells 10 from which the digital data were read are not the floating gate FET memory cells 10 to which the higher density data are written. When data from an entire row of floating gate FET memory cells 10 has been written to a new location, the row line can be set to an appropriate voltage to erase the stored data from the entire row line of floating gate FET memory cells in one step.

Figure 8:
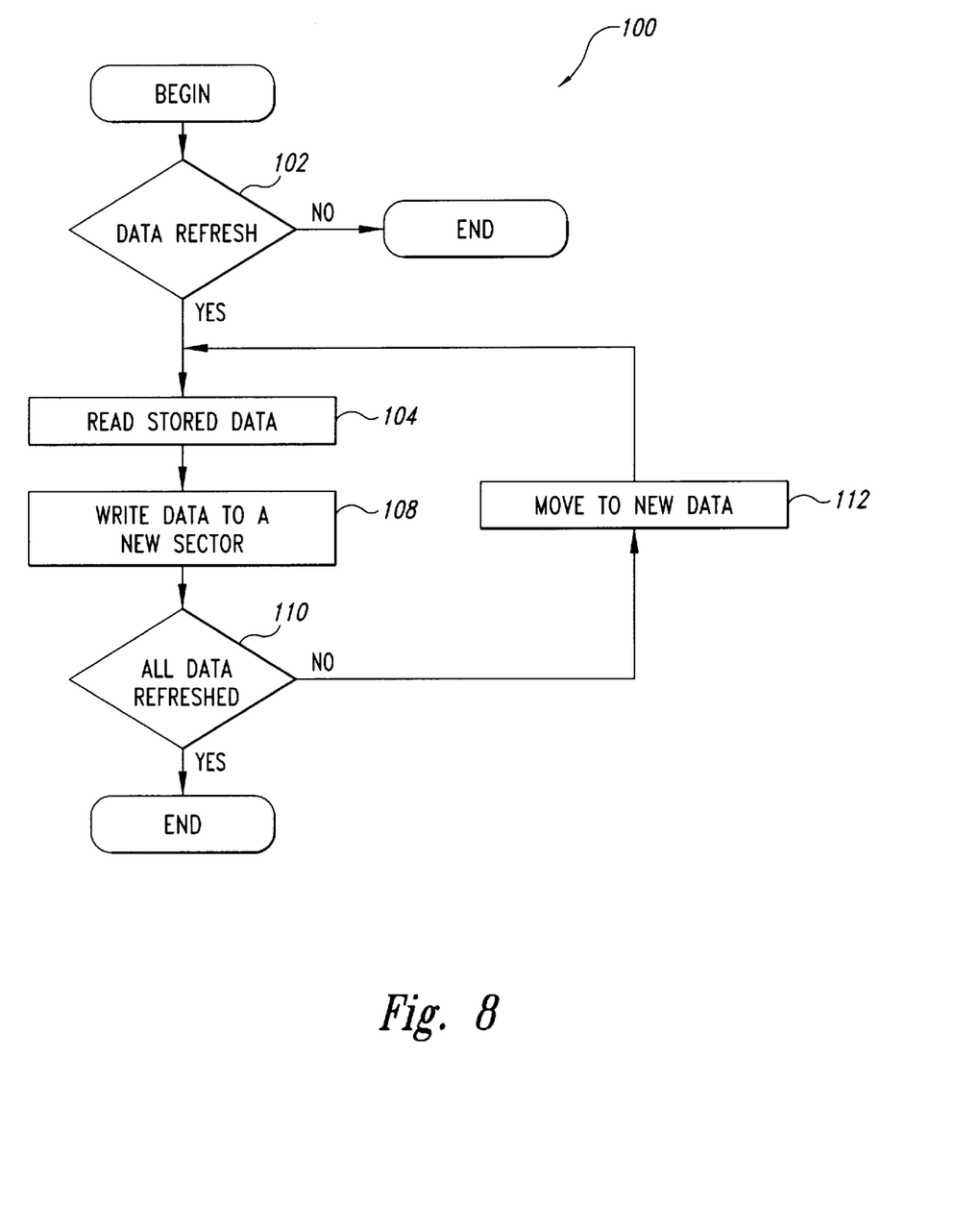
FIG. 8 is a simplified flowchart describing a method for refreshing data in the floating gate FET memory device of FIG. 4, in accordance with an embodiment of the present invention.

FIG. 8 is a simplified flowchart describing a process 100 for refreshing data in the floating gate FET memory device 40 of FIG. 4, in accordance with an embodiment of the present invention. The process 100 begins with a query task 102 that determines when it is appropriate to refresh stored data.

For example, it may be inappropriate to refresh stored data during a time when it is probable that need for instant access to the memory device 40 of FIG. 4 is likely. It may be desirable to refresh stored data following a suitable storage latency, e.g., annually, monthly or at some other fixed interval. It may be desirable to refresh stored data when 'markers' or known stored values placed in the array 41 have exhibited some predetermined shift from their initial values. It may be desirable to refresh stored data after some time-temperature product has elapsed. For example, it may be desirable to halve the storage time for every 10 degrees Celsius increase in average device temperature over some nominal value, or to employ some other known relationship between expected storage latency and temperature.

When the query task 102 determines that it is not appropriate to refresh stored data, the process 100 ends. When the query task 102 determines that it is appropriate to refresh stored data, stored data are read from the array 41 in a step 104. In a step 108, the read data are written back into another sector of the array 41 that has been erased or is unused.

In some applications, digital data may be needed, and refreshed digital data corresponding to the read analog values are written back to the array 41. This may be the case where digital comparison of data sets is most efficient, where digital data are required for transmnission to another portion of the host device or other locations, where it has been determined that greater storage latency is desirable for a data set or for other reasons. When a query task 110 determines that all data in need of refreshing have been refreshed, the process 100 ends. When the query task 110 determines that not all data in need of refreshing have been refreshed, the process 100 moves to a new area in the array 41 where data need to be refreshed in a step 112 and the steps 104, 106, 108, 110 and 112 are iterated until all of the data needing to be refreshed have been refreshed. The process 100 then ends.

The teachings of the present invention allow a single memory IC product line to serve needs that previously were met using custom-developed memory ICs suited to individual purchaser's needs. Additionally, the present invention allows the configuration and characteristics of the memory device to be dynamically reconfigured, even after it has been in use in a host device.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. A memory comprising:
    an array of floating gate FET memory cells;
    a write circuit coupled to the array for writing digital or analog data to memory cells in the array;
    a digital read circuit coupled to the array for reading digital data from memory cells in the array;
    an analog read circuit coupled to the array for reading analog data from memory cells in the array;
    a controller providing control signals to the digital and analog read circuits and the write circuit; and
    a multiplexer having a first input coupled to the digital read circuit, a second input coupled to the analog read circuit, and an output for providing data to a host device the output coupled to the write circuit.

2. The memory of claim 1 wherein the write circuit is configured to convert digital values read from the array to analog values in response to commands from the controller.

3. The memory of claim 1, further comprising an analog-to-digital converter having an input coupled to the analog read circuitry and having an output coupled to the write circuit, the analog-to-digital converter configured to convert analog values read from the array to digital values in response to commands from the controller.

4. The memory of claim 1, further comprising a refresh circuit coupled to the analog read and the write circuits, the refresh circuit determining when to command the analog read circuit to read analog values from the array and then have the write circuit write refreshed analog values corresponding to the read analog values to a portion of the array different from a portion of the array from which the read values were obtained.

5. The memory of claim 1, further comprising a refresh circuit coupled to the analog read and the write circuits, the refresh circuit determining when to command the analog read circuit to read analog values from the array and then have the write circuit write refreshed data corresponding to the read analog values to the array.

6. The memory of claim 1, further comprising a refresh circuit coupled to the controller, the refresh circuit determining when to read stored data from the array and then write refreshed data corresponding to the read data to the array.

7. The memory of claim 1 wherein the array, the controller, the digital read circuit, the analog read circuit and the write circuit are all formed on a single integrated circuit.

8. The memory of claim 2 wherein the controller is adapted to function as a sleep mode detector to:
    determine when the memory will not be accepting input data for storage in the array;
    determine when digital data are stored in the array;
    command the digital read circuitry to read the digital data from the array when it is determined that the memory will not be accepting input data and there are digital data stored in the array; and
    command the write circuit to store analog data corresponding to the read digital data in the array.

9. The memory of claim 1 wherein the array of memory cells comprises an allay of floating gate FET memory cells.

10. The memory of claim 1 wherein each of the memory cells forming the array of memory cells includes a floating gate FET comprising:
    a gate electrode;
    a gate dielectric formed adjacent the gate electrode;
    a floating conductor formed within the gate dielectric; and
    a channel region formed adjacent the gate dielectric and having source and drain regions disposed on opposed ends of the channel region, the gate electrode being separated from the channel region by the gate dielectric and floating conductor, wherein a drain-source conduction characteristic of the channel region is responsive to charge stored on the floating conductor.

11. The memory of claim 1 wherein the analog read circuit includes an operational amplifier having at least first and second inputs and an output, the output being coupled to a gate of a floating gate memory cell to be read, the first input being coupled to a drain of the floating gate FET memory cell to be read and the second input being coupled to a voltage reference source.

12. A memory integrated circuit comprising:
    an array of memory cells that store either digital or analog data;
    read-write circuitry that reads digital or analog data from, and writes digital or analog data to, the array, the circuitry comprising a multiplexer having inputs for receiving the read digital or analog data, and an output coupled to a host device and to an input of a write portion of the read-write circuitry;
    an analog-to-digital converter that converts analog data read from the array to corresponding digital data, the analog-to-digital converter having an input coupled to an output to the read-write circuitry and an output coupled an input to the read-write circuitry; and
    a controller causing the read-write circuitry to read digital data from the array for storage as corresponding analog values and causing the read-write circuitry to write the corresponding analog values to the array in response to predetermined criteria.

13. The memory integrated circuit of claim 12 wherein the controller is further configured as a sleep mode detector that determines when the memory integrated circuit will not be inputting and storing additional data and that then provides the predetermined criteria.

14. The memory integrated circuit of claim 12, further comprising a refresh controller that determines when data stored in the array require refreshing, the refresh controller providing commands to the read-write circuitry to read the stored data from the array when the stored data require refreshing and providing commands to the read-write circuitry to write refreshed data corresponding to the read data to the array.

15. The memory integrated circuit of claim 12 wherein the write portion of the read-write circuitry comprises a digital-to-analog converter, and further wherein the array of memory cells comprises an array of floating gate FET memory cells.

16. The memory integrated circuit of claim 12 wherein each of the memory cells forming the allay of memory cells includes a field effect transistor comprising:
   a gate electrode;
   a gate dielectric formed adjacent the gate electrode;
   a floating conductor formed within the gate dielectric; and
   a channel region formed adjacent the gate dielectric and having source and drain regions disposed on opposed ends of the channel region, the gate electrode being separated from the channel region by the gate dielectric and floating conductor, wherein a drain-source conduction characteristic of the channel region is responsive to charge stored on the floating conductor.

17. A method for storing data in a memory array comprising:
   inputting first digital data;
   coupling the first digital data to a write circuit coupled to the memory array for selectively writing digital and analog data to the memory array;
   writing analog data corresponding to the first digital data from the write circuit to the memory array;
   inputting second digital data;
   coupling the second digital data to the write circuit;
   writing the second digital data to the memory array in digital form;
   reading stored digital data from the memory array; and
   storing analog data corresponding to the read digital data in the memory array.

18. The method of claim 17, further comprising:
   determining when the memory array is not being used to read or write data in response to commands from a source external to the memory array; and
   reading stored digital data and writing corresponding analog data to memory when the act of determining indicates that the memory array is not being used to read or write data.

19. The method of claim 17 wherein reading stored digital data comprises:
   reading stored digital data from a first portion of the memory array; and
   storing analog data corresponding to the read digital data in a second portion of the memory array.

20. The method of claim 17, further comprising:
   storing data describing characteristics of data stored in different sectors of the memory array in a portion of the memory array.

21. The method of claim 17, further comprising:
   reading stored analog data from the memory array;
   refreshing the stored analog data; and
   writing the refreshed analog data to the memory array.

22. The method of claim 18, further comprising:
   reading data describing locations and storage densities of analog data stored in the memory array from a portion of the memory array;
   reading stored analog data from the memory array using the data describing locations and storage densities;
   refreshing the stored analog data; and
   writing the refreshed analog data to another portion of the memory array.

23. A method for operating a memory comprising:
   reading stored digital data from the memory with a digital read circuit coupled to the memory; and
   writing analog data corresponding to the stored digital data to the memory through a write circuit configured to convert digital data read from the memory to analog data, and through a multiplexer having an input coupled to the digital read circuit and an output coupled to the write circuit.

24. The method of claim 23, further comprising writing data describing locations and data densities of data stored in the memory to a portion of the memory.

25. The method of claim 23 wherein:
   reading stored digital data from the memory comprises reading stored digital data from floating gate FET memory cells in the memory; and
   writing the corresponding analog data to the memory comprises writing the corresponding analog data to floating gate FET memory cells in the memory.

26. A method of dynamically allocating characteristics of portions of a memory comprising:
   determining a first data storage density;
   determining a first number of memory cells to have the first data storage density;
   allocating a first portion of an array of memory cells to provide at least the first number of memory cells;
   programming first data into the first portion of memory cells using the first data storage density;
   determining that the first data storage density is no longer required;
   determining that the first data is no longer required; and
   reallocating the first portion of the array to have a data storage density different than the first data storage density.

27. The method of claim 26, further comprising writing data describing the first data storage density and addresses of the first number of memory cells to a reference portion of the array of memory cells.

28. The method of claim 26, further comprising after programming the first data:
   determining a second data storage density;
   determining a second number of memory cells to have the second data storage density;
   allocating a second portion of an array of memory cells to provide at least the second number of memory cells; and
   programming second data into the second portion using the second data storage density.

29. The method of claim 26, further comprising writing data describing the reallocation of the first portion of the array to a reference portion of the array of memory cells.

30. A memory, comprising:
   an array of floating gate FET memory cells;
   a write circuit coupled to the array for writing digital or analog data to memory cells in the array;
   a digital read circuit coupled to the array for reading digital data from memory cells in the array;
   an analog read circuit coupled to the array for reading analog data from memory cells in the array, the analog read circuit including an operational amplifier having at least first and second inputs and an output, the output being coupled to a gate of a floating gate memory cell to be read, the first input being coupled to a drain of the floating gate FET memory cell to be read and the second input being coupled to a voltage reference source; and a controller providing control signals to the digital and analog read circuits and the write circuit.

31. The memory of claim 30, further comprising a multiplexer having a first input coupled to the digital read circuit, a second input coupled to the analog read circuit, and an output for providing data to a host device, the output coupled to the write circuit.

32. The memory of claim 30 wherein the write circuit is configured to convert digital values read from the array to analog values in response to commands from the controller.

33. The memory of claim 30, further comprising an analog-to-digital converter having an input coupled to the analog read circuitry and having an output coupled to the write circuit, the analog-to-digital converter configured to convert analog values read from the array to digital values in response to commands from the controller.

34. The memory of claim 30, further comprising a refresh circuit coupled to the analog read and the write circuits, the refresh circuit determining when to command the analog read circuit to read analog values from the array and then have the write circuit write refreshed analog values corresponding to the read analog values to a portion of the array different from a portion of the array from which the read values were obtained.

35. The memory of claim 30, further comprising a refresh circuit coupled to the analog read and the write circuits, the refresh circuit determining when to command the analog read circuit to read analog values from the array and then have the write circuit write refreshed data corresponding to the read analog values to the array.

36. The memory of claim 30, further comprising a refresh circuit coupled to the controller, the refresh circuit determining when to read stored data from the array and then write refreshed data corresponding to the read data to the array.

37. The memory of claim 30 wherein the array, the controller, the digital read circuit, the analog read circuit and the write circuit are all formed on a single integrated circuit.

38. The memory of claim 34 wherein the controller is adapted to function as a sleep mode detector to:

determine when the memory will not be accepting input data for storage in the array;

determine when digital data are stored in the array;

command the digital read circuitry to read the digital data from the array when it is determined that the memory will not be accepting input data and there are digital data stored in the array; and command the write circuit to store analog data corresponding to the read digital data in the array.

39. The memory of claim 30 wherein the array of memory cells comprises an array of floating gate FET memory cells.

40. The memory of claim 30 wherein each of the memory cells forming the array of memory cells includes a floating gate FET comprising:

a gate electrode;

a gate dielectric formed adjacent the gate electrode;

a floating conductor formed within the gate dielectric; and a channel region formed adjacent the gate dielectric and having source and drain regions disposed on opposed ends of the channel region, the gate electrode being separated from the channel region by the gate dielectric and floating conductor, wherein a drain-source conduction characteristic of the channel region is responsive to charge stored on the floating conductor.

* * * * *